INVENTOR.
ROBERT A. RUEHRWEIN
BY Herman O. Bauermeister
ATTORNEY

Nov. 16, 1965 R. A. RUEHRWEIN 3,218,203

ALTERING PROPORTIONS IN VAPOR DEPOSITION PROCESS TO FORM A MIXED CRYSTAL GRADED ENERGY GAP

Filed Oct. 9, 1961 2 Sheets-Sheet 2

INVENTOR.
ROBERT A. RUEHRWEIN

BY Herman O. Bauermeister

ATTORNEY

United States Patent Office 3,218,203
Patented Nov. 16, 1965

3,218,203

ALTERING PROPORTIONS IN VAPOR DEPOSITION PROCESS TO FORM A MIXED CRYSTAL GRADED ENERGY GAP

Robert A. Ruehrwein, Clayton, Mo., assignor to Monsanto Company, a corporation of Delaware Filed Oct. 9, 1961, Ser. No. 143,881
9 Claims. (Cl. 148—175)

Figure 1:
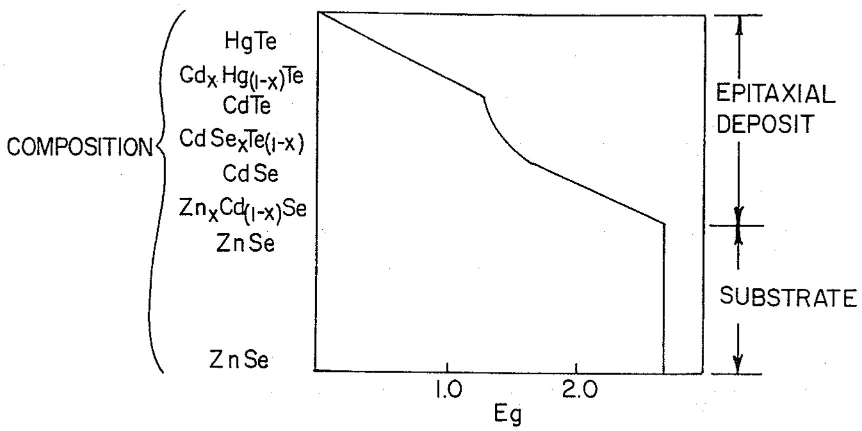

The present invention relates to a method for the production of epitaxial films of large single crystals of inorganic compounds and to articles of manufacture based upon the novel process. Epitaxial films which may be prepared in accordance with the invention described herein are prepared from volatile compounds and elements of beryllium, zinc, cadmium and mercury with volatile compounds and elements of sulfur, selenium and tellurium. Typical compounds within this group include the binary compounds beryllium sulfide, zinc selenide, cadmium telluride, mercury selenide and cadmium sulfide. As examples of ternary compositions within the defined group are those having the formulae $Z_nS_xSe_{(1-x)}$ and $CdS_xSe_{(1-x)}$, $x$ having a numerical value greater than zero and less than 1.

The epitaxial films of the present invention are characterized as graded energy gap crystals. A graded energy gap crystal is characterized by a nonuniformity of composition which results in a corresponding nonuniformity in the forbidden energy gap of the material. The nonuniformity of the forbidden energy gap may be one of gradual increase or decrease in a given direction in a linear or non-linear manner or any other type of profile. the range over which the forbidden energy gap can vary is governed by the elemental components that make up the crystal. For the materials of the present invention the energy gap of the crystal may vary from about .025 to about 4 e. volts. It is an object of the invention to provide the novel graded energy gap epitaxial films by a new process which makes possible the controlled grading in any desired profile. It is also an objective of the invention to provide articles of manufacture such as junction type photovoltaic cells, photoelectro magnetic energy conversion cells, transistors and photoconductors.

It is an object of this invention to provide a new and economical method for the production of the above described types of crystals and devices which are characterized as epitaxial single crystal having a graded forbidden energy gap.

A still further object of this invention is the formation and deposition of epitaxial films of the above-described materials upon substrates of the same or different materials.

The specific II–VI compounds of this invention are of unusual purity and have the necessary electrical properties for use as semiconductor components and are prepared by the reaction of a gaseous II compound, such as mercury halide and a gaseous VI compound, such as tellurium halide in the presence of hydrogen. Examples of mercury compounds which are gaseous under the present reaction conditions include the mercury halides, e.g., mercury dichloride, mercury dibromide, and mercury diiodide; and also alkyl mercury compounds such as dimethyl mercury, diethyl mercury, dipropyl mercury, diisopropyl mercury, and di-*tert*-butyl mercury. Other group II starting materials which are employed in the present invention include the elements beryllium, zinc, cadmium and mercury as well as their halides and alkyl compounds. Such metals are preferably employed as the halides, for example, the chlorides, bromides and iodides, although the various alkyl and halo-alkyl derivatives may similarly be used. The group VI elements employed per se or compounds thereof which are of particular utility include tellurium halides and their hydride derivatives. The elements or their chlorides are preferred as the source material for the group VI components employed in the present method. The halides which are contemplated include sulfur monochloride, sulfur monobromide and sulfur dichloride, selenium tetrachloride and tellurium tetrachloride.

In conducting the vapor phase reaction between the group II and the group VI component for the production of a crystalline solid II–VI compound of the present class, it is essential that gaseous hydrogen be present in the system, and that oxidizing gase be excluded. However, when the group II and group VI elements (or hydrides) are used simultaneously it is unnecessary to use molecular hydrogen, but it may be used as a carrier. The mole fraction of the II component in the gas phase (calculated as the mole fraction of the monatomic form of the II compound or element) preferably is from 0.01 to 0.15, while the mole fraction of the VI component is from 0.05 to 0.50 (also calculated with respect to the monatomic form of the VI compound or element). The mole fraction of the hydrogen may vary in the range of from 0.35 to 0.94. It should be recognized that this representation of partial pressure imposes no limitation upon the total pressure in the system which may vary in the range of from 0.1 micron to several atmospheres, for example, 7500 mm. Hg.

The mole fraction of the group VI starting material such as halide, for example, tellurium tetrachloride, is preferably at least equivalent to, and still more preferably greater than the mole fraction of the group II component, for example, zinc dichloride, or other group II compound which is employed. A preferred embodiment is the use of a mole fraction for the group VI component which is at least twice that of the group II component. The mole fraction of hydrogen should then be at least twice that of the combined mole fraction of the group II and group VI components.

The temperature used in carrying out the reaction between the above described II component and the VI component will generally be above about 300° C. to as much as 1500° C., a preferred operating range being from 400° C. to 1200° C. and a still more preferred range being from 500° C. to 1100° C.

The only temperature requirements are that the temperatures within the reservoirs containing the group II and group VI component sources be maintained above the dew points of the vaporized components therein. For the II compound or element this is usually within the range of from 200–1000° C. and for the VI compound, from +100 to 900° C. The time required for the reaction is dependent upon the temperature and the degree of mixing and reacting. The II and VI gaseous components may be introduced individually through nozzles, or may be premixed as desired.

The apparatus employed in carrying out the process of the present invention may be any of a number of types. The simplest type constitutes a closed tube of a refractory material such as glass, quartz or a ceramic tube such as mullite into which the starting reactant materials are introduced together with the hydrogen vapor. The tube is then sealed off and subjected to temperatures within the range of from 400 to 1500° C. for a period of from less than one minute to one hour or more, until the reaction is complete.

The contacting and vapor phase precipitation may be carried out in a closed system which is completely sealed off after the hydrogen is introduced with the II component and the VI component, or by use of a continuous gas flow system. The pressure which is obtained in the single-vessel, closed system corresponds to the pressure exerted by the added hydrogen vapor at the operating temperatures. The pressure in the system may be varied over a considerable range such as from 0.1 micron to 10 atmospheres, a preferred range being from 0.5 to 1.0 atmosphere.

On a larger scale, the present process is operated as a continuous flow system. This may constitute a simple reaction tube in which the substrate crystal is located and in which the hydrogen gas is then passed to flush oxygen from the system. Into this tube are passed the group II and group VI reactants carried by hydrogen along the same or one or more additional conduits. The II–VI compound formed in the reaction tube deposits as an epitaxial layer on the substrate crystal. Various other modifications including horizontal and vertical tubes are also contemplated, and recycle systems in which the exit gas after precipitation of the single crystal product is returned to the system is also desirable, particularly in larger scale installations.

In addition to making the epitaxial films by providing separate sources of the group II component and the group VI component it is also possible to make the epitaxially grown crystals of the present invention by reacting hydrogen chloride, hydrogen bromide, or hydrogen iodide with a II–VI compound at a sufficiently elevated temperature to provide gaseous products consisting of group II compounds and group VI elements or compounds. These gaseous reaction products will then further react in a region of the system at lower temperature to redeposit the original II–VI compound. Consequently the present process is adaptable to a wide variety of starting materials and may also be used to obtain products of very high purity by employing the II–VI compound for redeposition. The reaction system accordingly may consist of a number of zones to provide for the introduction of volatile components which undergo reaction to form the ultimate II–VI epitaxial film in the form of a graded gap product.

An advantage of the present method for the production of epitaxial films of II–VI compounds by the reaction in the vapor phase of a group II component and group VI component is the ease of obtaining high purity products. In contrast to this method, the conventional method for the preparation of II–VI compounds beginning with the respective elements from the group II and group VI series consists of merely adding together the two reactants. The high-temperature vapor-phase reaction employed in the present method inherently introduces a factor favoring the production of pure materials, since the vaporization and reaction of the respective group II and group VI components results in a rejection of impurities. The desired reaction for the production of the II–V compound occurs between the group II component, the group VI component, and hydrogen to yield the II–VI compound. As a result, it is found that unusually pure materials which are of utility in various electrical and electronic applications such as in the manufacture of semiconductors are readily obtained.

The most important aspect of this invention is the provision of a means of preparing and depositing graded energy gap epitaxial films of the purified single crystal material onto various substrates. These deposited graded gap crystals existing as films of any desired thickness permit the fabrication of new electronic devices discussed hereinafter. The characteristic feature of epitaxial film formation is that starting with a given substrate material, e.g., mercury selenide, having a certain lattice structure and oriented in any direction, a film, layer or overgrowth of the same or different material may be vapor-deposited upon the substrate. The vapor deposit has an orderly atomic lattice and settling upon the substrate assumes as a mirror-image the same lattice structure and geometric configuration of the substrate. When using a certain material, e.g., gallium antimonide as the substrate and another material, e.g., Hg selenide as the film deposit it is necessary that lattice distances of the deposit material closely approximate those of the substrate in order to obtain an epitaxial film.

The present invention provides for a novel process for preparing graded energy gap crystals which permits precise control of the gradation of the energy gap along the crystal. Heretofore, graded energy gap crystals have been prepared by employing a diffusion technique wherein one component was diffused into a crystal made up of one or more other components, for example diffusing mercury into a cadmium telluride crystal. However, the gradation of the energy gap in crystals prepared in this manner is limited to the profile that is governed by the diffusion process and no wide control of the graded gap profile is possible. A second method that has been employed to make graded energy gap crystals has been to grow the crystals from the melt while gradually changing the melt composition and thus gradually changing the composition of the solidfying crystal. However, this method is readily adaptable only to large crystals and also does not readily permit control of melt composition and particularly over wide ranges of alteration in melt components.

The advance which has been made by the present invention is a greatly improved control of the gradation of the composition of the crystal and hence the gradation of the energy gap of the crystal. Any desired gradation profile can readily be attained in the product crystal by the present process by regulating the composition of the reactant gases. Furthermore, the dimensions of the graded gap crystal prepared by the present process can be controlled over a wide range from a fraction of a micron in thickness to several millimeters in thickness or larger.

A particular advantage of the present method for the production of epitaxial films of II–VI compounds by the reaction in the vapor phase of a group II component and a volatile group VI component in the presence of hydrogen is that in forming the epitaxial layer on the substrate, the substrate is not affected and therefore sharp changes in impurity concentration can be formed. By this method it is possible to prepare sharp and narrow junctions, such as p-n junctions, which cannot be prepared by the conventional methods of diffusing and alloying.

The growing of a graded gap film by the process of the present invention is carried out by placing a single crystal, polished and oriented, of the substrate material in a silica or other tube. The foundation material is thus available for the manufacture of an epitaxial film which will have the further characteristic of a graded gap structure. In order to conduct this process the reactants are supplied at controlled rates in order to vary gradually the proportions of the II and the VI components in the ultimate product. When streams of hydrogen are employed to carry the reactants into the reaction zone, separate streams of hydrogen which may be of equal or unequal volume flow are led through reservoirs containing the reactants, heated to appropriate temperatures to maintain the desired vapor pressure of the reactant. For example, the employment of one region at a considerably higher temperature will introduce relatively larger proportions of such reactant. The separate streams of hydrogen carrying, for example, cadmium bromide, mercury chloride and selenium chloride are led into the silica tube containing the substrate crystal and heated to the reaction temperature. A single crystal film of compound, in the present example, $Cd_{0.85}Hg_{0.15}As$, deposits on the substrate and is oriented in the same direction as the substrate. With continued flow of the three respective reactants, the gradation to obtain a higher proportion of mercury with a decrease of cadmium is carried out by uniformly programming the flow rates of the three components. For example, with the growth of the crystal a uniform increase in the mercury chloride addition with a corresponding equal diminution of the cadmium bromide flow yields a composition at an intermediate point corresponding to $Cd_{0.63}Hg_{0.37}As$. With further growing of the graded epitaxial film the composition of the mixed binary crystal is further varied at the continuous rate described above to obtain a final composition corresponding to the formula $Cd_{0.20}Hg_{0.80}As$. In the more general case the compound $M_xR_{(1-x)}T$ where $x$ can be any value from zero to one depends upon the relative concentration or partial pressure of the M reactant relative to the R reactant in the reactor tube. In this manner the composition of the depositing material can be gradually altered in accordance with any desired profile including a linear relationship, an exponential relationship or any other shape such as sinusoidal. This result is accomplished by altering the relative flow rates of the reactants entering the reaction zone for example, by controlling the relative flow rates of hydrogen which carry the reactants from the separate reservoirs of the reactants. Other methods for controlling the addition rate of the respective reactants are temperature control of the reservoir of a volatilizable component such as tellurium or tellurium chloride or of the single source of two components, e.g., a II–VI compound such as cadmium selenide which decomposes in the presence of HCl to be carried as a gaseous stream of cadmium chloride, elemental selenium and hydrogen into the reaction zone.

The introduction of dopant materials in accordance with a graded schedule is also a part of the present invention. Thus the desired material for introducing silver into epitaxial cadmium selenide is similarly controllable to provide a continuous or discontinuous variation of the silver content at various levels of the graded gap epitaxial film.

The thickness of the epitaxial film may be controlled as desired and is dependent upon reaction conditions such as temperatures within the reactor, hydrogen flow rates and time of reaction. In general, the formation of large single crystals and thicker layers is favored by higher temperatures as defined above, and lower hydrogen pressures and larger flow rates.

Representative individual binary crystals of the group II and group VI components contemplated in this invention are listed in the table with the value of their forbidden energy gap.

*Table*

| Compound: | Energy gap, electron volts |
|---|---|
| ZnS | 3.7 |
| ZnSe | 2.6 |
| CdS | 2.4 |
| ZnTe | 2.1 |
| CdSe | 1.77 |
| CdTe | 1.50 |
| HgSe | 0.65 |
| HgTe | 0.025 |

It is well known that combinations of these compounds can be formed to give mixed binary crystals, including ternary and quarternary compositions, which have a value of the forbidden energy gap different from those of the two parent binary crystals and usually having a value that is intermediate between those of the parent binary crystals. For example, the forbidden energy gap of $Cd_{.5}Hg_{.5}Te$ is about 0.25 electron volt. Other such combinations have the formulae $$BeS_xSe_{(1-x)},\ Be_xZn_{(1-x)}S,\ ZnSe_xTe_{(1-x)},\ Zn_xCd_{(1-x)}Se,$$
$$CdSe_xTe_{(1-x)},\ Cd_xHg_{(1-x)}Te,\ HgSe_xTe_{(1-x)},$$
$$Zn_yCd_{(1-y)}Se_xTe_{(1-x)} \text{ and } CdS_x(Se_yTe_{(1-y)})_{(1-x)}$$

where $x$ and $y$ have a numerical value greater than zero and less than one. As the composition of the mixed binary crystals is gradually altered, i.e., as the value of $x$ and $y$ is altered, the corresponding value of the energy gap is also gradually and uniformly altered. Thus it is possible by the process of the present invention to grow crystals having a graduation of energy gap which varies over a wide range. For example, starting with a substrate of a zinc selenide crystal, $Zn_xCd_{(1-x)}Se$ is epitaxially deposited on the substrate while varying $x$ from one to zero as the growth progresses, then $CdSe_xTe_{(1-x)}$ is epitaxially deposited while varying $x$ from one to zero, then $Cd_xHg_{(1-x)}Te$ is epitaxially deposited while varying $x$ from one to zero. The resulting crystal thus has an energy gap of about 2.6 on one face and an energy gap of about 0.025 on the opposite face. A diagram of this crystal and its graded gap profile is represented in FIG. 1. It is readily apparent that any profile of gradation of the energy gap can be made by altering the composition of the growing crystal as desired.

Single crystals of II–VI compounds such as the sulfides, selenides and tellurides of beryllium, zinc, cadmium, and mercury are used as substrates for epitaxial overgrowths of II–VI compounds.

Similarly, materials useful as substrates herein include single crystal II–VI compounds having the cubic sodium chloride type structure may be used as substrates for epitaxial growth of the II–VI compounds when the II–VI crystals face upon which growth is to occur is the (III) crystallographic face. In this manner the oxides, sulfides, selenides and tellurides of magnesium, calcium, strontium and barium, as well as cadmium oxide, are used as substrates. Preferred II–VI compounds include zinc sulfide, zinc selenide, zinc telluride, cadmium sulfide, cadmium selenide, cadmium telluride, mercury sulfide, mercury selenide, mercury telluride, beryllium sulfide, beryllium selenide and beryllium telluride.

Other materials useful as substrates herein include compounds of elements of groups III and V (III–V compounds) and compounds of groups I and VII elements (I–VII compounds), and the elements silicon and germanium are suitable substrates. Suitable dimensions of the seed crystal are 1 mm. thick, 10 mm. wide and 15–20 mm. long, although larger or smaller crystals may be used.

As will be described hereinafter, the materials used herein either as films or substrates or both may be used in a purified state or containing small amounts of foreign materials as "doping" agents.

The significance of structures having epitaxial films is that electronic devices utilizing "surface junctions" may readily be fabricated. Devices utilizing n-p or p-n junctions are readily fabricated by vapor depositing the host material containing the desired amount and kind of impurity, hence, conductivity type, upon a substrate having a different conductivity type. In order to obtain a vapor deposit having the desired conductivity type and resistivity, trace amounts of an impurity, e.g., an element or compound thereof selected from group I of the periodic system, e.g., copper, silver and gold or an element or compound thereof selected from group V of the periodic system, e.g., phosphorus, arsenic and antimony are incorporated into the reaction components in order to produce p-type conductivity, and an element or compound thereof from group III, e.g., boron, aluminum, gallium and indium to produce n-type conductivity. These "impurities" are carried over with the reactant materials into the vapor phase and deposited in a uniform dispersion in the epitaxial film of the formed product on the substrate. Since the proportion of dopant deposited with the II–VI compound is not necessarily equal to the proportion in the reactant gases the quantity of dopant added corresponds to the level of carrier concentration desired in epitaxial film to be formed.

The doping element may be introduced in any manner known in the art, for example, by chemical combination with or physical dispersion within the reactants. Other examples include adding volatile dopant compounds such as $InCl_3$ to the reservoir of the group II and/or VI components, or the dopant can be added with a separate stream of hydrogen from a separate reservoir.

The substrate materials used herein may be doped by conventional means known to the art. For example, the doping agent may be introduced in elemental form or as a volatile compound of the dopant element during preparation of the substrate crystal in the same manner described above for doping the epitaxial film. Also, the dopant may be added to a melt of the substrate compound during crystal growth of the compound. Another method of doping is by diffusing the dopant element directly into the substrate compound at elevated temperatures.

The quantity of dopant used will be controlled by the electrical properties desired in the final product. Suitable amounts contemplated herein range from $1 \times 10^{15}$ to $5 \times 10^{20}$ atoms/cc. of product.

Vapor deposits of the purified material having the same conductivity type as the substrate may be utilized to form intrinsic pp+ or nn+ regions.

As mentioned above, a plurality of layers of epitaxial films may be deposited upon the substrate material. This is accomplished, e.g., by vapor depositing consecutive layers one upon the other. For example, a first film of one of the materials described herein, e.g., cadmium telluride is vapor deposited upon a substrate of indium antimonide. Subsequently, a quantity of the same material with different doping agents or different concentrations of the same dopant or another of the described materials may be vapor deposited from starting materials comprising these elements with a fresh quantity of hydrogen as a second epitaxial film over the epitaxial film of cadmium telluride already deposited on the substrate. This procedure with any desired combination of layers can be repeated any number of times wherein one or more of the deposited layers has a graded forbidden energy gap as prepared by the method of this invention.

Alternatively, after the first layer of material is vapor deposited upon the substrate, the substrate with this epiaxial layer is removed to another reaction tube and a second material is then vapor deposited as before upon the substrate with its first epitaxial layer, thereby forming a two-layered component.

In each of these processes, the thickness of the graded gap film and the impurity concentration are controllable to obtain a variety of electrical effects required for specific purposes as discussed elsewhere herein.

Various electronic devices to which these epitaxially filmed graded gap semiconductors are applicable include diodes, (e.g., tunnel diodes), parametric amplifiers, transistors, high frequency mesa transistors, solar cells, thermophotovoltaic cells, components in micromodule circuits, rectifiers, thermoelectric generators, radiation detectors, optical filters, watt-meters, and other semiconductor devices.

The invention will be more fully understood with reference to the following illustrative specific embodiments:

EXAMPLE I

This example illustrates the formation and deposition of an epitaxial graded gap film on n-type CdTe as the substrate.

A polished crystal of n-type CdTe one millimeter thick and containing $1 \times 10^{17}$ carriers/cc. is placed in a fused silica reaction tube located in a furnace. The CdTe crystal is placed on a silica support inside said tube. The reaction tube is heated to 600° C. and a stream of hydrogen is directed through the tube for 15 minutes to remove oxygen from the surface of the CdTe.

A stream of hydrogen is then directed through a reservoir of $CdBr_2$ maintained at about 600° C. thus vaporizing the $CdBr_2$ which is then carried by the hydrogen through a heated tube from the reservoir to the reaction tube containing the CdTe substrate crystal.

Meanwhile, separate streams of hydrogen are conducted through separate tubes containing in one of them a reservoir of $TeCl_4$ heated to about 330° C. and in the other a reservoir of $InCl_3$ (as a doping component) heated to about 170° C. From the heated tubes the $TeCl_4$ and $InCl_3$ are carried by the hydrogen on through the tubes to the reaction tube. In the system the mole fractions of the $CdBr_2$, $TeCl_4$ and $H_2$ are 0.05, 0.15 and 0.80, respectively. The separate streams of vaporized $CdBr_2$, $TeCl_4$ and $InCl_3$ conjoin in the fused silica reaction tube where a reaction occurs between the cadmium and tellurium components in which a single crystal film of n-type cadmium telluride begins to form on the substrate crystal of CdTe. After the film begins to form, the hydrogen flow rate through the $CdBr_2$ reservoir is gradually reduced while at the same time the flow rate of a hydrogen stream through a separate tube leading to the reaction tube and containing a reservoir of mercury heated to about 260° C. is started and gradually increased so that the mole fraction of the sum of the two group II components is maintained about constant in the reaction tube. During the interval a single crystal deposit of $$Cd_xHg_{(1-x)}Te$$

is formed on the substrate with $x$ decreasing from one to zero as the deposition proceeds. When the hydrogen flow rate through the $CdBr_2$ reservoir has been reduced to zero, the hydrogen flow through all of the tubes is terminated. The epitaxially grown crystal removed from the reaction tube is composed of cadmium telluride on one (bottom) face and mercury telluride, n-type, on the opposite (top) face and contains about $10^{17}$ carriers per cc. The side edges of the crystal after lapping them are of graded composition from CdTe to HgTe.

Figure 2:
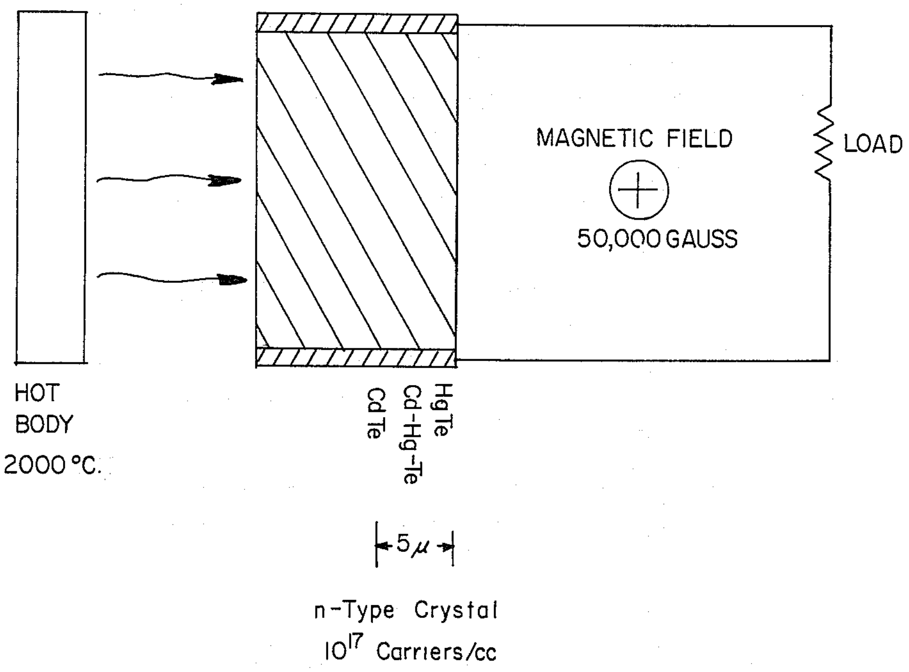

Metallic leads are attached to two aforesaid graded composition opposite edges of the crystal and the crystal is placed in a magnetic field of about 50,000 gauss as shown in FIG. 2. Upon irradiating the CdTe face of the crystal with radiation from a hot body heated to about 2000° C., electrical potential is generated in the crystal. It is found that the efficiency of conversion of the radiant energy falling on the crystal to electrical energy withdrawn from the crystal is about 20%.

In general, the relative positioning of the face of the crystal is such as to receive the incoming radiation. The direction between the two leads at the side edges of the crystal then establish a base direction, together with the direction of variation of the composition of the epitaxial layer, so that for effective operation of the photo cell the direction of the magnetic field is at least partly in the direction of the normal to these two critical directions.

The photovoltaic cells of the present invention are based upon the various mixed binary compositions with a graded energy gap as described above. The general formula for these compositions is $M_xR_{1-x}T_yZ_{1-y}$ wherein M and R are different elements of the group of beryllium, zinc, cadmium and mercury, and T and Z are different elements of the group of sulfur, selenium and tellurium, and wherein $x$ and $y$ vary in the range of values of zero to one.

In a preferred embodiment of the photoelectromagnetic cell the relationship between the chemical elements constituting the graded forbidden energy gap epitaxial film is such that M is of smaller atomic weight than R, and T is of smaller weight than Z and $x$ and $y$ continually decrease from a maximum value of one to a minimum value of zero in the direction from the front, light receptive surface to the back of the crystal.

EXAMPLE 2

Figure 3:
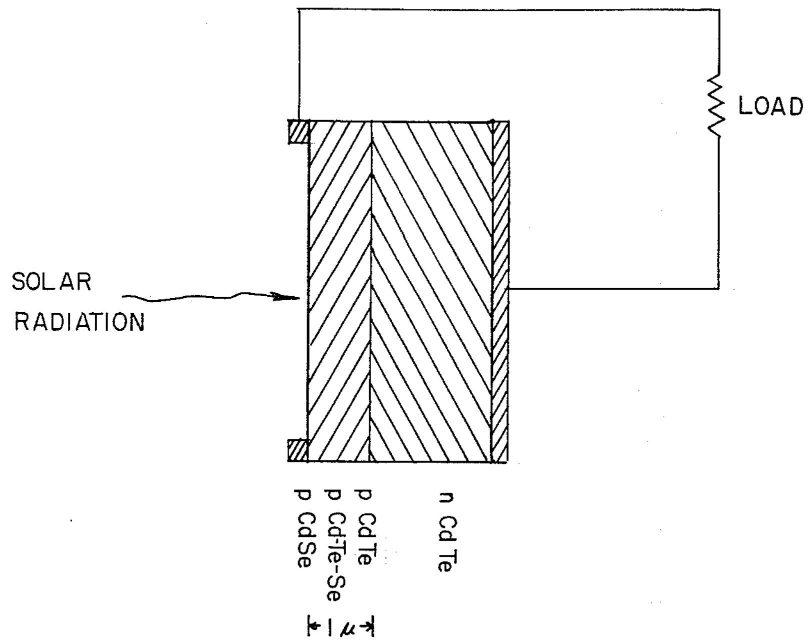

This example illustrates the formation and deposition of a p-type epitaxial graded gap film on n-type CdTe as the substrate, in a solar cell as illustrated in FIGURE 3.

The same general procedure outlined in Example 1 is repeated. The substrate crystal in the reaction tube is an n-type ($10^{17}$ carriers per cc.) CdTe crystal heated to about 800° C. CdTe, p-type with $10^{20}$ carriers per cc., is contained in one reservoir heated to about 900° C. and p-type CdSe ($10^{20}$ carriers per cc.) is contained in a second reservoir heated to about 900° C. After flowing hydrogen through the reaction tube for 15 minutes to remove oxygen from the substrate crystal, a stream of hydrogen chloride gas is initiated through the CdTe reservoir and into the reaction tube. After CdTe begins to epitaxially deposit on the CdTe substrate crystal the flow rate of the hydrogen chloride through the CdTe reservoir is slowly reduced while at the same time the flow rate of a stream of hydrogen chloride through the CdSe reservoir is initiated and gradually increased. During this interval $CdTe_xSe_{(1-x)}$ is deposited with $x$ decreasing from one to zero as the deposit proceeds. After the gas flow rate through the CdTe reservoir has reached zero, the hydrogen chloride stream through the CdSe reservoir is also terminated. The epitaxially grown crystal in the reaction tube is composed of CdTe on one (bottom) face and CdSe on the opposite (top) face and contains about $10^{20}$ carriers per cc. (p-type). Thus the crystal consists of a graded energy gap, p-type epitaxial film on an n-type substrate. Metallic leads are attached to the n-type substrate and the p-type film and connected through an external load. Upon irradiating the p-type face of the crystal with solar radiation, electrical potential is generated in the crystal. The efficiency of conversion of the radiant energy falling on the crystal to electrical energy withdrawn from the crystal is about 18%.

EXAMPLE 3

The same general procedure outlined in Example 1 is repeated. A CuBr crystal substrate is heated to about 500° C. Zinc dibromide, heated to about 490° C. is provided in one reservoir; $SeCl_4$ heated to about 160° C. is provided in a second reservoir; and $S_2Cl_2$ heated to about 115° C. is provided in a third reservoir. Separate streams of hydrogen are led through $ZnBr_2$ and $SeCl_4$ reservoirs and into the reaction chamber. After deposition of ZnSe commences on the CuBr substrate crystal, the flow rate of the hydrogen tube through the $SeCl_4$ reservoir is gradually reduced while at the same time the flow rate of a hydrogen stream through the $S_2Cl_2$ reservoir is initiated and gradually increased so that the mole fraction of the sum of the two group VI components is maintained about constant in the reaction tube. During this interval $ZnSe_xS_{(1-x)}$ is deposited while $x$ decreases from one to zero as the deposition proceeds. When the flow rate of the hydrogen stream through the $SeCl_4$ has reached zero, the flow of hydrogen through the other reservoirs is also terminated. The crystal which has been epitaxially grown on the CuBr substrate is composed of ZnSe next to the CuBr and of ZnS on the face which is last to deposit. Tests show that this crystal is a photoconductor.

EXAMPLE 4

Figure 4:
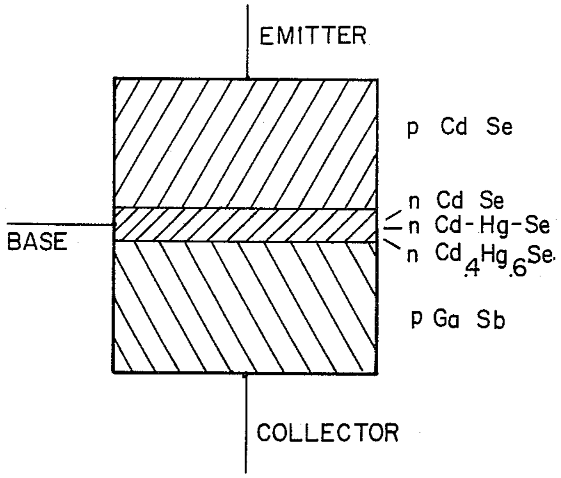

(*Transistor as shown in FIGURE 4 on GaSb substrate*)

The same general procedure outlined in Example 1 is repeated. The substrate single crystal in the reaction chamber is p-type ($10^{15}$ carriers per cc.) gallium antimonide heated to about 800° C. Reservoirs are provided which contain, respectively, $CdBr_2$ heated to about 600° C., $HgCl_2$ heated to about 230° C., $SeCl_4$ heated to about 160° C., $GaCl_3$ heated to about 130° C., and AgI heated to about 630° C. The last two components are used as dopants. After flushing the reaction tube with hydrogen, streams of hydrogen of about equal flow rate are led through the $CdBr_2$ and $HgCl_2$ reservoirs and a stream of hydrogen of about double flow rate is led through the $SeCl_4$ reservoir. At the same time a stream of hydrogen is led through the $GaCl_3$ reservoir. After the deposition on the substrate crystal commences the flow rate of the hydrogen stream through the $CdBr_2$ reservoir is gradually increased while at the same time the flow rate of hydrogen through the $HgCl_2$ reservoir is gradually decreased so that the mole fraction of the sum of the two group II components is maintained about constant in the reaction tube. When the flow rate of the hydrogen stream through the $HgCl_2$ reservoir reaches zero, the flow of hydrogen through the $SeCl_4$ reservoir is terminated while at the same time the flow of hydrogen through the AgI reservoir is initiated. After operating with these latter conditions for a period of about 15 minutes, all gas flows are terminated. The crystal which has been epitaxially grown on the p-type GaSb crystal is composed of an n-type layer of $Cd_{0.4}Hg_{0.6}Se$ next to the GaSb crystal with a composition gradation to CdSe and then a p-type layer of CdSe. The intermediate graded gap n-type film contains $10^{16}$ carriers per cc. and the last-to-deposit p-type CdSe contains $10^{18}$ carriers per cc. After lapping the edges of the crystal, leads are connected to the three separate p, n, p regions and the crystal exhibits transistor action with improved emitter efficiency and improved high frequency response.

It will be seen that the products obtained according to the present invention have a variety of applications. For example, in electronic devices where it is desirable to have a substantially inert non-conducting base for II–VI graded gap semiconductors, the product described in Example 3 is highly suitable. Where it is desired to obtain semiconductor components having semiconducting properties in the base material as well as in the epitaxial film, those products described in Examples 1, 2, and 4 above are of particular value.

Electronic devices may also be fabricated wherein a semiconducting component comprising an epitaxial graded gap film of II–VI compositions is deposited on substrates of metallic conductors having cubic crystal structure, such as gold, silver, calcium, cerium, cobalt, iron, iridium, lanthanum, nickel, palladium, platinum, rhodium, strontium, thorium and copper, and alloys such as Al–Zn, SbCoMn, BTi and $Cr_2Ti$.

The drawings of the present invention illustrate certain specific embodiments of the invention.

FIGURE 1 shows a graded forbidden energy gap profile produced as an epitaxial deposit upon a substrate. FIGURE 2 shows a photoelectromagnetic cell based upon a graded energy gap material produced in accordance with the process of the present invention. FIGURE 3 shows a solar cell, and FIGURE 4 illustrates a transistor employing the present graded forbidden energy gap materials.

Various other modifications of the instant invention will be apparent to those skilled in the art without departing from the spirit and scope thereof.

I claim:

1. Process for the production and deposition of graded forbidden energy gap epitaxial films of mixed binary crystals comprising elements selected from the group II elements of the class of beryllium, zinc, cadmium and mercury, and group VI elements of the class of sulfur, selenium and tellurium onto a substrate material selected from the class consisting of III–V compounds, I–VII compounds, II–VI compounds, germanium and silicon, which comprises reacting in the vapor phase at least one volatile component of the class of elements and compounds of the aforesaid group II elements together with at least one volatile component of the class of elements and compounds of the aforesaid group VI elements, provided that the sum of the group II components and group VI components reacted is greater than two, in the presence of hydrogen while excluding oxidizing gases and contacting the resulting reaction mixture with said substrate whereby a purified single crystal form of mixed binary crystals is deposited from said reaction mixture as an epitaxial film on said substrate, while progressively altering the relative proportions of the two reactants of the same group as the deposition proceeds.

2. Process for the production and deposition of epitaxial films of three-component mixed binary crystals comprising elements selected from the group II elements of the class of beryllium, zinc, cadmium and mercury, and group VI elements of the class of sulfur, selenium and tellurium onto a substrate material selected from the class consisting of III–V compounds, I–VII compounds, II–VI compounds, germanium and silicon, which comprises reacting in the vapor phase at least one volatile component of the class of elements and compounds of the aforesaid group II elements together with at least one volatile component of the class of elements and compounds of the aforesaid group VI elements, provided that the sum of the group II components and group VI components reacted equals three, in the presence of hydrogen while excluding oxidizing gases, and contacting the resulting reaction mixture with said substrate material, while progressively altering the relative proportions of the two reactants of the same group as the deposition proceeds.

3. Process according to claim 2 whereby said volatile II components are cadmium dibromide and mercury and said group VI compound is tellurium tetrachloride and the deposited film is $Cd_xHg_{(1-x)}Te$ where $x$ varies in the range of values of greater than zero to less than one as the deposition proceeds and said substrate is crystalline cadmium telluride.

4. Process according to claim 2 whereby said volatile group II compound is zinc dibromide and said group VI compounds are selenium tetrachloride and sulfur dichloride and the deposited film is $ZnSe_xS_{(1-x)}$ where $x$ varies in the range of values of greater than zero to less than one as the deposition proceeds and said substrate is crystalline cuprous bromide.

5. Process according to claim 2 whereby said volatile group II compound is cadmium chloride derived from reaction of HCl gas with cadmium telluride and cadmium selenide and said group VI elements are tellurium and selenium also derived from said reaction of HCl gas with the cadmium dibromide, mercury, and tellurium deposited film is $CdTe_xSe_{(1-x)}$ where $x$ varies in the range of values of greater than zero to less than one as the deposition proceeds and said substrate is crystalline cadmium telluride.

6. Process according to claim 2 whereby said volatile group II compounds are cadmium dibromide and mercury dichloride and said group VI compound is selenium tetrachloride and the deposited film is $Cd_xHg_{(1-x)}Se$ where $x$ varies in the range of values greater than zero to less than one as the deposition proceeds and said substrate is crystalline gallium antimonide.

7. Process as in claim 6 in which there is added with the cadmium dibromide, mercury dichloride, and selenium tetrachloride, the compound gallium trichloride as a doping agent whereby the deposited $Cd_xHg_{(1-x)}Se$ is n-type.

8. Process according to claim 3 in which there is added with the cadmium dibromide, mercury, and tellurium tetrachloride, the compound indium trichloride as a doping agent whereby the deposited $Cd_xHg_{(1-x)}Te$ is n-type.

9. Process according to claim 6 in which there is added with the cadmium dibromide, mercury dichloride, and selenium tetrachloride, the compound silver iodide as a doping agent whereby the deposited $Cd_xHg_{(1-x)}Se$ is p-type.

References Cited by the Examiner

UNITED STATES PATENTS

| | | | |
|---|---|---|---|
| 2,692,839 | 10/1954 | Christensen et al. | 148—175 |
| 2,798,989 | 7/1957 | Welker | 148—1.5 |
| 2,895,858 | 7/1959 | Sangster | 148—1.5 |
| 2,910,394 | 10/1959 | Scott et al. | 148—1.5 |
| 2,929,859 | 3/1960 | Loferski | 252—62.3 |
| 2,949,498 | 8/1960 | Jackson | 136—89 |
| 2,974,064 | 3/1961 | Williams et al. | 252—62.3 |
| 2,986,591 | 5/1961 | Swanson et al. | 136—89 |
| 3,072,507 | 1/1963 | Anderson | 149—33.4 |

FOREIGN PATENTS

| | | |
|---|---|---|
| 1,193,194 | 10/1959 | France. |
| 1,029,941 | 5/1958 | Germany. |

OTHER REFERENCES

Holonyak, Jr., et al.: Article in AIME publication of Metallurgy of Semiconductor Materials, Aug. 30–Sept. 1, 1961, vol. 15, Interscience Publishers, pp. 49–59.

Marinace: "Vapor Growth of InSb Crystals by an Iodine Reaction," IBM Technical Disclosure Bulletin, vol. 3, No. 8, January 1961, page 33.

Lyons et al.: "Forming a Compound PN Junction," IBM Technical Disclosure Bulletin, vol. 3, No. 8, January 1961, page 31.

Antell et al.: "Preparation of Crystals of In As, In P, Ga As, and Ga P by Vapor Phase Reaction," Journal of the Electrochemical Society, vol. 106, June 1959, pages 509–510.

BENJAMIN HENKIN, *Primary Examiner.*

JOHN H. MACK, DAVID L. RECK, *Examiners.*